United States Patent [19]

Morishita et al.

[11] 4,293,592
[45] Oct. 6, 1981

[54] METHOD FOR PRODUCTION OF PRINTED CIRCUITS BY ELECTROLESS METAL PLATING

[75] Inventors: Hirosada Morishita; Mineo Kawamoto; Kanzi Murakami, all of Hitachi, Japan

[73] Assignee: Hitachi, Ltd., Tokyo, Japan

[21] Appl. No.: 747,723

[22] Filed: Dec. 6, 1976

Related U.S. Application Data

[63] Continuation of Ser. No. 549,673, Feb. 13, 1975, abandoned.

[30] Foreign Application Priority Data

Feb. 15, 1974 [JP]  Japan .................................. 49-17567

[51] Int. Cl.³ .............................................. C23C 3/02
[52] U.S. Cl. ........................................ 427/98; 427/97; 427/304; 427/305; 427/307; 427/259; 427/282; 156/668
[58] Field of Search .................. 427/97, 98, 304, 305, 427/307, 282, 259; 156/628, 668, 664; 252/794

[56] References Cited

U.S. PATENT DOCUMENTS

| | | | |
|---|---|---|---|
| 3,202,612 | 8/1965 | Nelson | 252/79.4 |
| 3,269,861 | 8/1966 | Schneble et al. | 427/98 |
| 3,443,988 | 5/1969 | McCormack et al. | 427/258 |
| 3,506,482 | 4/1970 | Hirohata | 427/97 |
| 3,562,038 | 2/1971 | Shipley | 427/98 |
| 3,632,435 | 1/1972 | Eriksson | 427/97 |
| 3,640,765 | 2/1972 | Distefano | 427/98 |
| 3,676,213 | 7/1972 | Marton | 427/305 |

*Primary Examiner*—John D. Smith
*Attorney, Agent, or Firm*—Craig and Antonelli

[57] ABSTRACT

A method is provided for producing printed circuits by electroless deposition of metal on an insulating substrate to form a circuit film which comprises contacting an insulating substrate having initiator on a negative pattern of a thermo-setting resin whose activity for deposition of initiator for electroless metal plating is substantially reduced and on a positive pattern for circuit with an aqueous solution of an organic acid and hydrochloric acid and/or nitric acid before electroless plating the positive pattern by immersing the substrate in an electroless metal plating solution to substantially dissolve and remove the initiator on the surface of said negative pattern.

11 Claims, 1 Drawing Figure

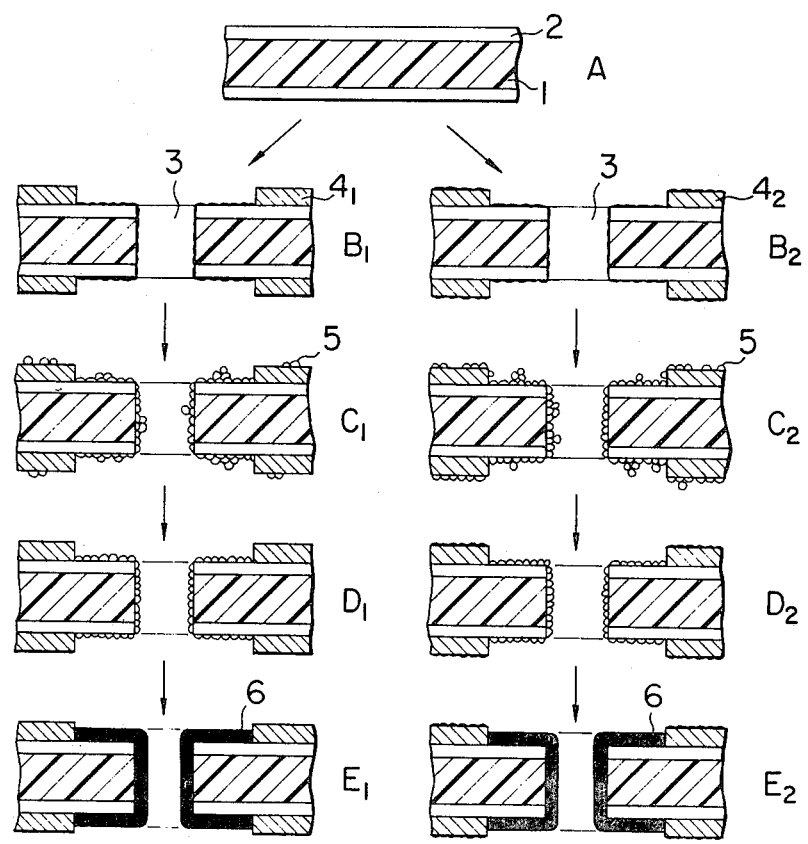

METHOD FOR PRODUCTION OF PRINTED CIRCUITS BY ELECTROLESS METAL PLATING

This is a continuation of application Ser. No. 549,673 filed Feb. 13, 1975 now abandoned.

BACKGROUND OF THE INVENTION

It is well known for electroless metal plating on an insulating substrate such as plastics to previously deposit an initiator for electroless metal plating such as palladium (Pd) on the surface of the substrate and then to immerse the thus treated substrate in an electroless metal plating solution.

According to said method, a printed circuit is produced by selective deposition of electroless metal on only the circuit area. For this purpose, said initiator such as Pd is selectively deposited on only the circuit area or Pd is deposited on the whole surface and then areas which are not to be subjected to electroless metal plating are masked with resin and the like. Since the selective deposition of the initiator as in the former method is difficult, the latter method has been proposed. For example, see U.S. Pat. No. 3,666,549. However, even by the latter method, it is impossible to prevent deposition of electroless metal on the resin which masks the undesired areas. Even such slight deposition of electroless metal causes short pass in printed circuits which require high density and accuracy. Therefore, such deposition of electroless metal on the areas other than the circuit areas must be prevented by all means.

It is not clear why electroless metal is deposited on the masking resin, but it is supposed that a part of the initiator such as Pd which is deposited on the circuit areas is shed and deposited on the resin surface. It is also supposed that the fine surface imperfections present on the masking resin have catalytic action for deposition of the electroless metal. The surface imperfections in this case mean areas on which electroless metal is deposited without deposition of initiator. It has been proposed to prevent deposition of electroless metal on the areas other than the circuit areas by applying materials capable of neutralizing the surface imperfections. For example, see U.S. Pat. No. 3,443,988. However, since printed circuits which have a plated film of large thickness require a long plating time, deposition of metal on unwanted areas cannot be prevented only by such method.

SUMMARY OF THE INVENTION

The object of the present invention is to provide a method for production of printed circuits by electroless metal plating according to which no electroless metal is deposited on the areas other than the circuit areas.

Other objects will be apparent from the following description.

BRIEF DESCRIPTION OF THE FIGURE

The accompanying FIGURE illustrates one example or production steps according to the present invention.

DETAILED DESCRIPTION

As mentioned before, a poison capable of lowering the catalytic activity in the vicinity of surface imperfections was applied to the masked resin in an attempt to prevent deposition of electroless metal due to surface imperfections of the masked resin, but the deposition could not be prevented.

The present invention provides a method for production of printed circuits where no electroless metal is deposited on areas other than circuit areas and the characteristics of the present invention reside in the following two points.

(1) Areas other than circuit areas are masked with a thermo-setting resin having substantially reduced activity for deposition of initiator for electroless metal plating (negative pattern).

(2) Then, before the printed circuit substrate having said negative pattern is plated by immersing in an electroless metal plating solution, the substrate is allowed to contact with a solution of an organic acid and hydrochloric acid and/or nitric acid (a washing liquid for initiator) to dissolve and remove the initiator present on the negative pattern.

For substantially reducing the activity for deposition of the initiator on the negative pattern masking resin, there are two methods, namely, water repellency is imparted to the resin to prevent attack by the initiator which is in the form of an aqueous solution or an inhibitor capable of inhibiting the deposition of initiator or capable of reducing the sticking strength of the initiator is applied to the resin.

Thus, the initiator on the negative pattern area (masking resin) is restrained from being deposited and simultaneously is decreased in its sticking strength. The initiator formed is removed by the initiator washing liquid referred to in the above (2), whereby deposition of electroless metal can be prevented.

The present invention will be specifically explained below with reference to the accompanying drawing.

As shown in step A, adhesive layer 2 is formed on the surface of insulating substrate 1. This adhesive layer is for giving anchoring effect to electroless metal plated film of circuit by forming irregularities by etching it and this is not essential for the present invention. Then, as shown in step B, the necessary through-hole 3 is excavated and then plating resist 4 is formed on the areas other than the circuit pattern areas with the resin having the function as mentioned in the above (1). Then, etching is carried out to form irregularities on the surface of adhesive layer 2. When water repellent resin is used, etching degree of the surface of plating resist 4, is lower than that of circuit pattern areas as shown in step $B_1$ and amount of initiator 5 deposited is smaller as shown in step $C_1$. When an inhibitor is applied, initiator 5 is deposited on resist $4_2$, but sticking strength of the initiator is decreased due to the inhibitor as shown in step $C_2$. Although the sticking strength of the initiator is decreased, the initiator cannot be removed by the usual water washing and the like.

Both substrates in steps $C_1$ and $C_2$ as they are cannot be avoided from deposition of electroless metal due to the initiator on the resist. Therefore, it is necessary for removing the initiator on the resist to dissolve and remove it with the initiator washing liquid as explained in the above (2). In this case, the washing liquid must be able to completely remove the initiator on the resist, but the object of the present invention cannot be accomplished if it removes the initiator on the circuit. Thus, compositions of the washing liquid are important. By contacting with the washing liquid, a substrate where the initiator adheres to only the circuit areas as shown in step D is obtained.

Thus obtained substrate is immersed in a known electroless metal plating solution to obtain a printed circuit having plated film 6 on only the circuit areas as shown in step E.

The plating resist on the negative pattern according to the present invention will be explained in more detail.

The plating resist is formed by coating by silk-screen process, etc. on a substrate a resist composition which is mainly composed of thermo-setting resins such as epoxy, polyester, phenol resin, etc. or resin compositions comprising said resins and melamine, alkyd, etc., hardner and hardening catalyst, to which additives mentioned hereinafter and, if necessary, pigments, fillers and solvents are added and which has a viscosity of about $10^2$–$10^4$ poises (at 25° C.), preferably $2\times10^2$–$1\times10^3$ poises (at 25° C.), and then drying and hardening thus coated composition by heating.

The additives for attaining the present invention include those which impart water repellency and inhibitors. As the additives imparting water repellency, silicone resin, waxes, etc are used. These are used preferably in an amount of 2–20 parts by weight per 100 parts by weight and said resin composition. As the inhibitors, those which can substantially reduce the activity for the deposition of initiator are effective and said catalyst poisons are also effective. Examples of the inhibitors are sulfur, selenium, arsenic, zinc, antimony, aluminum, iron, manganese, chromium, lead, phosphorus, cadmium, vanadium, or oxides, chlorides, salts thereof such as $SeO_2$, $Se_2O_3$, $Na_2SeO_4$, $BaSeO_4$, $As_2Se_3$, $Na_2HAsO_4$, $ZnHAsO_4$, $AsCl_3$, $As_2S_3$, $ZnO$, $ZnCl_2$, $ZnSO_4$, $ZnS$, $Sb_2O_3$, $Sb_2S_3$, $SbCl_5$, $Al_2(SO_4)_3$, $NH_4AlO_2$, $Al(NO_3)_2$, $FeCl_3$, $Fe_2O_3$, $CrO_3$, $PbCrO_4$, $Na_2Cr_2O_7$, $K_2Cr_2O_7$, $2PbCO_3\cdot Pb(OH)_2$, $PbSO_4$, $PbO$, $PbCl_2$, $MnO_2$, $KMnO_4$, $P_2O_5$, $NaH_2PO_2$, $PCl_5$, $CdS$, $CdO$, $V_2O_5$, $K_2S$, $Na_2S$, $CaS$, $LiS$, $CuS$, $BaS$, $Na_2S_2O_3$, $K_2S_2O_3$, persulfates, perchlorates, perborates such as $(NH_4)_2S_2O_8$, $Na_2S_2O_2O_8$, $K_2S_2O_8$, $KClO_4$, $NaClO_4$, $Ca(ClO_4)_2$, $NaBO_3$, $KBO_3$, $LiBO_3$. Furthermore, examples of inhibitors of organic compounds are thiols such as thioglycol, thioethanol, mercaptan, etc., thioamino acids such as cystine, cysteine, thioserine, ethionine, methionine, etc., thioureas such as thiourea, p-hydroxyphenyl-thiourea, etc., five-membered rings containing nitrogen and sulfur such as thiazole, 2-mercaptobenzothiazole, thiadiazole, etc. oxyquinolines and organic acids such as malic acid, oxalic acid, formic acid, acetic acid, citric acid, ethylenediaminetetraacetic acid, etc. Among these inhibitors, sulfides of alkali metals and organic thiols are especially effective. At least one of these inhibitors are dissolved or dispersed in said resin composition in an amount of 1–30 parts by weight, preferably 3–20 parts by weight per 100 parts by weight of said resin composition to obtain the desired resist composition. Some of said inhibitors may also serve as hardner or hardening catalyst for the resin and in this case, said range of amount may be ignored.

Viscosity of said water repellent resist compositions or those to which inhibitor is added is adjusted within the range as mentioned above depending on the kind of coating method and then is coated as a plating resist on the negative pattern by silk screen process, etc. and dried and hardened at 100°–170° C. for 10 minutes-2 hours. Addition of the inhibitor to said water repellent resist composition results in more excellent effect. Furthermore, if necessary, the inhibitor may also be applied to photopolymerizable photoresist.

The initiator washing liquid which is important in the present invention includes an aqueous solution of an organic acid and hydrochloric acid and/or nitric acid.

Hydrochloric acid has often been used in washing step in both electroplating and electroless plating, but the washing liquid of the present invention has such effect as never been attained by use of said hydrochloric acid. For example, if hydrochloric acid or nitric acid is used alone as the initiator washing liquid of the present invention, the initiator on the resist cannot be removed or even if it can be removed, initiator on the circuit areas are also removed and plated film is not formed on some of the circuit areas. Thus, appropriate control is impossible. In the case of the washing liquid of the present invention, such control is easy and stable.

As the organic acid in the washing liquid, at least one of malic acid, oxalic acid, tartaric acid, citric acid, etc. may be used. Mixing ratio of the organic acid and hydrochloric acid and/or nitric acid and concentration of the acids cannot be simply determined, but in the case of hydrochloric acid, preferably 5–100 g of organic acid or acids is dissolved in 1–4 N hydrochloric acid to make 1 l and in the case of nitric acid, preferably 5–100 g of organic acid or acids is dissolved in 0.1–0.5 N nitric acid to make 1 l. Combination of citric acid and hydrochloric acid is especially preferred.

Removal of initiator deposited on the surface of said resist with said washing liquid can sufficiently be attained by dipping therein at room temperature for 0.5–10 minutes.

In carrying out the electroless metal plating of a printed circuit according to the present invention, any known materials may be used except for the plating resist and the initiator washing liquid.

For example, various plastics, laminates, molding materials, etc. may be used as the insulating substrate.

As the adhesive layer, phenol modified nitrile rubber adhesives may be used. This phenol modified nitrile rubber adhesives comprises 15–25 parts by weight of phenolic resin, 6–10 parts by weight of rubber component such as nitrile rubber or butadiene rubber, 5–10 parts by weight of inorganic materials such as graphite, silicon oxide, etc. and other hardner, organic solvent, etc. and viscosity thereof is adjusted to 100 centipoises or more by adding a solvent. This adhesive may be coated on the substrate by roll-coating method, curtain coating method, etc. This can be dried and hardened at 120°–170° C. for 20–120 minutes. Thickness of 10–40μ is sufficient.

Fine irregularities are formed on the surface of said adhesive layer by etching with, e.g., an aqueous solution of $CrO_3$ or $H_2SO_4$ to provide anchoring effect for circuit film formed by electroless metal plating.

The initiator for electroless metal plating is exemplified by metals such as Pd, Ag, Au, Pt, Rh, Ni, etc. and in the case of Pd, Pd may easily be deposited by dipping in, for example, a solution of $PdCl_2$ and $SnCl_2$ in hydrochloric acid.

Regarding the electroless metal plating solution, the known solution mainly composed of (a) a metal salt such as copper sulfate, nickel sulfate etc., (b) a complexing agent such as potassium tartrate, ethylene diaminetetraacetic acid, etc., (c) a reducing agent such as formalin, paraformaldehyde, etc. and (d) NaOH may be used.

The present invention is illustrated more specifically in the following examples.

EXAMPLE 1

(Step 1): Phenol modified nitrile rubber adhesive (comprising 20 parts by weight of phenolformaldehyde resin, 5 parts by weight of acrylic resin, 10 parts by weight of nitrile rubber, 0.5 part by weight of zirconium, 0.3 part by weight of sulfur, 1.2 parts by weight of silicon oxide and 2 parts by weight of pyromellitic acid) was coated on one side of a laminate of 1.6 mm in thickness which comprised a paper substrate impregnated with phenolic resin (phenolic paper laminate) by curtain coating method and this was dried at 120° C. for 20 minutes. Then, the same coating was conducted on the other side of the substrate and heated at 170° C. for 60 minutes to harden it to obtain an adhesive layer of about 30μ in thickness on both sides.

(Step 2): Through-holes of 1.0 mm in diameter were excavated by a press at the predetermined place of the laminate.

(Step 3): Then, a resin composition was prepared by dissolving 30 parts by weight of phenol novolack type epoxy resin (DEN-438) produced by Dow Chemical Corp., U.S.A., 50 parts by weight of melamine resin (Melane 28) produced by Hitachi Chemical Co., 20 parts by weight of alkyd resin (Phthalkyd 804) produced by Hitachi Chemical Co., 10 parts by weight of silicone resin (ES 1001 N) produced by Shinetsu Kagaku K.K. which was for imparting water repellence and 0.5 part by weight of 2-ethyl-4-imidazole in 1:1 mixed solvent of methylethylketone-xylol to adjust the viscosity to 250 poises (at 25° C.). Said resin composition was coated on the areas on which plating was not desired (negative pattern) by silk-screen process and dried at 120° C. for 30 minutes. Similarly, said resist was coated on the negative pattern on the other side. This was heated at 150° C. for 30 minutes to harden it to form a plating resist of 15μ in thickness.

(Step 4): Then, said laminate was dipped in an etching solution prepared by dissolving 60 g of chromic anhydride ($CrO_2$) and 200 ml of sulfuric acid in water to make 1 l for 5 minutes (at 45° C.) to etch the surface.

(Step 5): Thus etched laminate was washed with water, dipped in 5 N hydrochloric acid for 1 minute, dipped in a sensitizer (Pd-initiator) HS-101B prepared by Hitachi Chemical Co. at room temperature for 5 minutes, washed with water, then dipped in an activating liquid (Accelerator ADP-101) prepared by Hitachi Chemical Co. at room temperature for 5 minutes and then washed with water.

(Step 6): After the series of the treatments as mentioned above, the laminate was dipped in an initiator washing liquid (No. 1) prepared by dissolving 30 g of citric acid in about 3 N hydrochloric acid to make 1 l at room temperature for 5 minutes.

(Step 7): Said laminate was subjected to electroless copper plating at 60° C. for 8 hours in an electroless copper plating solution (Metex RS-9038) prepared by Mac Dermid Inc., U.S.A. to form electroless copper plated film of 30μ in thickness on the circuit areas and inner wall of the holes, thereby to obtain a printed circuit board.

EXAMPLE 2

A printed circuit board was produced in the same manner as in Example 1 except that 3 parts by weight of paraffin wax was used in place of the silicone resin used as water repellent resin in step 3.

EXAMPLE 3

A through-hole type printed circuit board was produced in the same manner as in Example 1 except that a resist prepared by adding 3 parts by weight of $Sb_2O_3$ and 15 parts by weight of $K_2S$ whose particle size was adjusted to less than 70μ as inhibitor to 100 parts by weight of epoxy resin (DEN-438) prepared by Dow Chemical Corp., U.S.A. at 60° C., stirring and dispersing them, adding 0.5 part by weight of 2-ethyl-4-methylimidazole at room temperature, dissolving it in methylethylketone and well stirring it to adjust the viscosity to 500 poises at room temperature was used in place of the water repellent resist in step 3 in Example 1 and that the laminate was dipped at room temperature for 5 minutes in an initiator washing liquid (No. 2) prepared by dissolving 20 g of tartaric acid and 350 ml of 35% hydrochloric acid in water to make 1 l (about 3.5 N) in place of washing liquid (No. 1) used in step 6 in Example 1.

EXAMPLE 4

A through-hole type printed circuit board was produced in the same manner as in Example 1 except that a plating resist prepared by dissolving 5 parts by weight of thioglycol as an inhibitor in 100 parts by weight of DEN-438, then adding 10 ml of ethyl alcohol in which 5 parts by weight of thiourea as an inhibitor was dissolved, dissolving 0.5 part by weight of 2-ethyl-4-methylimidazole, and finally adding methylethylketone to adjust the viscosity to 600 poises at room temperature was used as the resist in step 3 and that the laminate was dipped in a washing liquid (No. 3) prepared by dissolving 5 g of citric acid and 200 ml of 35% hydrochloric acid in water to make 1 l (about 2 N) at room temperature for 8 minutes in place of the initiator washing liquid (No. 1) used in step 6 in Example 1.

EXAMPLE 5

A through-hole type printed circuit board was produced in the same manner as in Example 1 except that the plating resist used in Example 4 was used and that the laminate was dipped in a washing liquid (No. 4) prepared by dissolving 50 g of citric acid and 260 ml of 35% hydrochloric acid in water to make 1 l at room temperature for 7 minutes.

EXAMPLE 6

A through-hole type printed circuit board was produced in the same manner as in Example 1 except that the plating resist used in Example 4 was used and that the laminate was dipped at room temperature for 5 minutes in an initiator washing liquid (No. 5) prepared by dissolving 100 g of citric acid and 350 ml of 35% hydrochloric acid in water to make 1 l.

EXAMPLE 7

A through-hole type printed circuit board was produced in the same manner as in Example 1 except that a plating resist prepared in the following manner was used. That is, 50 parts by weight of epoxy resin (Epon 1001) produced by Shell Chemical Co. and 50 parts by weight of DEN-438 were dissolved in methylethylketone. Then, to the resultant solution was added a solution prepared by dissolving 4 parts by weight of dicyandiamide in methyl cellosolve, followed by stirring to obtain a solution having a viscosity of 500 poises. To the solution was added 0.5 part by weight of benzyldimethylamine, and then 5 parts by weight of selenium trioxide, particle size of which was adjusted to less than 70μ, was added as an inhibitor. Then, 15 parts by weight of 2-mercaptobenzothiazole as an inhibitor was added and stirring was carried out. Thereafter, temperature was elevated to 40° C. and $SiO_2$ powders of less than 1μ in diameter were added and stirred to adjust the viscosity at room temperature to 1000 poises.

EXAMPLE 8

A through-hole type printed circuit board was produced in the same manner as in Example 1 except that a plating resist used in Example 7 was used and that the laminate was dipped at room temperature for 7 minutes in a washing liquid (No. 6) prepared by dissolving 50 g of malic acid and 300 ml of 35% hydrochloric acid in water to make 1 l in place of the washing liquid (No. 1) at step 6 in Example 1.

EXAMPLE 9

A through-hole type printed circuit board was produced in the same manner as in Example 1 except that a plating resist prepared in the following manner was used. That is, 100 parts by weight of Epon 1001 produced by Shell Chemical Co. as an epoxy resin, 0.5 part by weight of 2-ethyl-4-methyl-imidazole and 20 parts by weight of CaS, particle size of which was adjusted to less than 70$\mu$, as an inhibitor were mixed for 30 minutes by a mixer. This was dissolved in methylethylketone to adjust the viscosity to 500 poises.

EXAMPLE 10

A through-hole type printed circuit board was produced in the same manner as in Example 1 except that a plating resist prepared by dissolving 100 parts by weight of epoxy resin (Epon 100) produced by Shell Chemical Co., 20 parts by weight of polysulfide resin, Thiokol LP-3 HS—$(C_2H_4OCH_2OC_2H_4$—S—S$)_6$—$C_2H_4OCH_2OC_2H_4$SH produced by Thiokol Chemical Corp. as inhibitor and 0.8 part by weight of 2-ethyl-4-methyl-imidazol in a mixed solvent of aromatic naphtha, methylisobutyllactone and cyclohexane (6:3:1) to adjust the viscosity to 600 poises and that the laminate was dipped in the washing liquid (No. 3) at room temperature for 8 minutes in place of the initiator washing liquid (No. 1) used at step 6 in Example 1.

EXAMPLE 11

A through-hole type printed circuit board was produced in the same manner as in Example 1 except that the laminate was dipped at room temperature for 3 minutes in washing liquids (No. 7) prepared by dissolving 50 g of citric acid and 20 ml of 62% nitric acid in water to make 1 l in place of the washing liquid (No. 1) at step 6 in Example 1.

EXAMPLE 12

A through-hole type printed circuit board was produced in the same manner as in Example 1 except that plating resist used in Example 3 was used and that the laminate was dipped at room temperature for 2 minutes in the washing liquid (No. 7) used in Example 11.

EXAMPLE 13

A plating resist prepared by dissolving in 100 parts by weight of unsaturated polyester resin (Polyset 518-100) having a viscosity of 100 poises at room temperature produced by Hitachi Chemical Co., 5 parts by weight of cystine as an inhibitor, 10 parts by weight of manganese dioxide as an inhibitor, particle size of which was adjusted to less than 70$\mu$, 0.5 part by weight of benzoyl peroxide as a hardening catalyst and 1.0 part by weight of dicumyl peroxide as a hardening catalyst was coated on circuit-undesired areas (negative pattern) of one side of the substrate by silkscreen process in the same manner as in Example 1 and this was heated at 130° C. for 1 hour to harden it. Then, similarly, the circuit-undesired areas on the other side was also coated and then this was heated at 130° C. for 1 hour to harden it. Thus, a film of 15$\mu$ in thickness was formed on the circuit-undesired areas on both sides. Steps 4-5 were carried out in the same manner as in Example 1. In step 6, the laminate was dipped at room temperature for 5 minutes in washing liquid (No. 8) prepared by dissolving 50 g of tartaric acid and 300 ml of 35% hydrochloric acid in water to make 1 l (about 3 N). Then, this laminate was subjected to electroless copper plating in electroless copper plating solution (CP-70) prepared by Shipley, U.S.A. at 50° C. for 8 hours to form a copper plated film of 30$\mu$ in thickness on circuit areas and walls of the holes, thereby to obtain a through-hole type printed circuit board.

EXAMPLE 14

A through-hole type printed circuit board was produced in the same manner as in Example 1 except that a plating resist prepared by dissolving 5 parts by weight of thiomalic acid as an inhibitor and 20 parts by weight of 2-mercaptobenzothiazole as an inhibitor in DEN-438, then dissolving it in methylethylketone to adjust the viscosity to 500 poises, and then adding thereto 0.5 part by weight of 2-ethyl-4-methylimidazole was employed.

EXAMPLE 15

A through-hole type printed circuit board was produced in the same manner as in Example 1 except that there was used the same plating resist as in Example 14 with the exception of substituting 5 parts by weight of 8-oxyquinoline for the thiomalic acid as the inhibitor and that the washing liquid (No. 3) used in Example 4 was used as the washing liquid at step 6.

EXAMPLE 16

3 Parts by weight of thiourea and 3 parts by weight of thioglycol as inhibitor were dissolved in 100 parts by weight of Photomal SPR (resin content 36% and viscosity 6 poises) which was a photopolymerizable photoresist mainly composed of acrylic copolymer and which was prepared by Tokyo Oka Kogyo K.K. in place of the water repellent resist used in Example 1. Then, the resultant solution was coated by roll-coater process five times on entire surface of one side of a laminate which had been subjected to the treatments of step 1 and 2 of Example 1 and then the coating layer was dried at 65° C. for 30 minutes. Thereafter, the other side of the laminate was also coated with said photoresist containing said inhibitor in the same manner as mentioned above and was dried to form a layer of 20$\mu$ in thickness on both sides. Then, circuit-undesired areas (negative pattern) on said laminate was irradiated with ultraviolet ray from carbon arc lamp to polymerize and harden the circuit-undesired areas on both sides of said laminate. Then, 1,1,1-trichloroethane adjusted to 20° C. was sprayed onto both sides of the laminate to dissolve and remove (develop) the unhardened resist of circuit areas. Then, this laminate was subjected to the treatments of the steps 4–7 of Example 1 to obtain a through-hole type printed circuit board.

EXAMPLE 17

A through-hole type printed circuit board was produced in the same manner as in Example 1 except that the resist used in Example 3 was employed and that there was used an initiator washing liquid (No. 9) prepared by dissolving 30 g of citric acid and 500 ml of 35% hydrochloric acid in water to make 1 l (about 5 N) in place of the washing liquid (No. 1) used at step 6 in Example 1.

EXAMPLE 18

A through-hole type printed circuit board was produced in the same manner as in Example 1 except that the resist used in Example 3 was used and that there was used initiator washing liquid (No. 10) prepared by dissolving 30 g of citric acid and 600 ml of 35% hydrochloric acid in water to make 1 l (about 6 N) in place of the washing liquid (No. 1) used at step 6 in Example 1.

EXAMPLE 19

A through-hole type printed circuit board was produced in the same manner as in Example 1 except that the same resist as used in Example 18 was used and that an initiator washing liquid (No. 11) prepared by dissolving 150 g of tartaric acid and 400 ml of 35% hydrochloric acid in water to make 1 l (about 4N).

EXAMPLE 20

A through-hole type printed circuit board was produced in the same manner as in Example 1 except that the resist used in Example 3 was used and that an initiator washing liquid (No. 12) prepared by dissolving 30 g of citric acid, 100 ml of 35% hydrochloric acid and 10 ml of 62% nitric acid in water to make 1 l was used in place of the initiator washing liquid (No. 1) used at step 6 in Example 1.

EXAMPLE 21

A through-hole type printed circuit board was produced in the same manner as in Example 1 except that an initiator washing liquid (No. 13) prepared by dissolving 10 g of citric acid and 30 g of tartaric acid in 2.5 N hydrochloric acid to make 1 l was used as an initiator washing liquid.

EXAMPLE 22

A phenolic paper laminate of 1.6 mm in thickness which was clad on both sides with a 70μ anodized aluminum foil (trade name: adclad laminates and grade: ADFR2-C of General Electric Co.) was used in place of the phenolic paper laminate coated with the adhesive at step 1 in Example 1 and said aluminum foil was dissolved and removed with hydrochloric acid. Then, the laminate was washed with water and dried. On the surface of thus treated laminate there were formed irregularities which provide anchoring effect of electroless metal plated film of circuit. Thereafter, steps 2–7 were conducted in the same manner as in Example 1 to obtain a through-hole type printed circuit board.

EXAMPLE 23

An epoxy glass cloth laminate of 1.6 mm in thickness which was clad on both sides with a 70μ anodized aluminum foil (trade name: adclad laminates and grade: ADFR4-C of General Electric Co.) was used in place of phenolic paper laminate coated with the adhesive at step 1 in Example 1 and said aluminum foil was dissolved and removed with hydrochloric acid. Then, the laminate was washed with water and dried. On the surface of thus treated laminate there were formed irregularities which provided anchoring effect of electroless metal plated film of circuit. Through-holes of 1.0 mm in diameter were excavated at the predetermined places of the laminate by a drill in place of the press at step 2 in Example 1. Steps 3 to 7 were carried out in the same manner as in Example 1 to obtain a through-hole type printed circuit board.

COMPARATIVE EXAMPLE 1

A through-hole type printed circuit board was produced in the same manner as in Example 1 except that the initiator washing step 6 was not carried out.

COMPARATIVE EXAMPLE 2

A through-hole type printed circuit board was produced in the same manner as in Example 1 except that the water repellent resist used in Example 2 was used and that the initiator washing step 6 was not carried out.

COMPARATIVE EXAMPLE 3

A through-hole type printed circuit board was produced in the same manner as in Example 1 except that the resist used in Example 3 was used and that the initiator washing step 6 was not carried out.

COMPARATIVE EXAMPLE 4

A through-hole type printed circuit board was produced in the same manner as in Example 1 except that the resist used in Example 4 was used and that the initiator washing step 6 was not conducted.

COMPARATIVE EXAMPLE 5

A through-hole type printed circuit board was produced except that the water repellent resist used in Example 1 from which silicone resin ES 1001N, namely, water repellent resin, was omitted was employed.

COMPARATIVE EXAMPLE 6

A through-hole type printed circuit board was produced except that the resist used in Example 7 from which the inhibitors, selenium trioxide and 2-mercaptobenzothiazole, were omitted was employed.

States of deposition of electroless metals in the above mentioned Examples and Comparative Examples are shown in the following Table.

TABLE

| | State of deposition of copper on the areas other than the circuit areas | State of deposition of copper on the circuit areas and wall of the hole |
|---|---|---|
| Example 1 | No deposition | Excellent |
| Example 2 | " | " |
| Example 3 | " | " |
| Example 4 | " | " |
| Example 5 | " | " |
| Example 6 | " | " |
| Example 7 | " | " |
| Example 8 | " | " |
| Example 9 | " | " |
| Example 10 | " | " |
| Example 11 | " | " |
| Example 12 | " | " |
| Example 13 | " | " |
| Example 14 | " | " |
| Example 15 | " | " |
| Example 16 | " | " |
| Example 17 | " | Partially not deposited |
| Example 18 | " | No deposition |
| Example 19 | " | Partially not deposited |
| Example 20 | " | Excellent |
| Example 21 | " | " |

TABLE-continued

| | State of deposition of copper on the areas other than the circuit areas | State of deposition of copper on the circuit areas and wall of the hole |
|---|---|---|
| Example 22 | " | " |
| Example 23 | " | " |
| Comparative Example 1 | Deposited on the entire surface of the areas | " |
| Comparative Example 2 | Deposited on the entire surface of the areas | " |
| Comparative Example 3 | Deposited on the entire surface of the areas | " |
| Comparative Example 4 | Deposited on the entire surface of the areas | " |
| Comparative Example 5 | Partially deposited | " |
| Comparative Example 6 | Partially deposited | " |

What is claimed is:

1. A method for producing a printed circuit by electroless metal plating wherein an insulating substrate having initiator for electroless metal plating on a negative pattern area of a thermo-setting resin, said thermo-setting resin comprising a thermo-setting resin composition containing at least one of epoxy resin, polyester resin and phenol resin and at least one of silicone resin and wax, activity of said resin for deposition of the initiator for electroless metal plating being substantially reduced, and a positive pattern area on which electroless plated film of the circuit is to be formed is allowed to contact with an initiator washing liquid of an aqueous solution consisting essentially of 5 to 100 grams of at least one organic acid selected from the group consisting of tartaric acid, citric acid, oxalic acid and maleic acid, and 1 to 4 N hydrochloric acid or 0.1 to 0.5 N nitric acid per one liter of said aqueous solution to dissolve and remove said initiator deposited on the negative pattern area before said insulating substrate is immersed in an electroless metal plating solution to form a circuit conductor by electroless plating on said positive pattern area.

2. A method for producing a printed circuit according to claim 1, wherein the thermo-setting resin comprises, for every 100 parts by weight of a thermo-setting resin composition containing at least one of epoxy resin, polyester resin and phenol resin, 2-20 parts by weight of at least one of silicone resin and wax.

3. A method for producing a printed circuit by electroless metal plating wherein an insulating substrate having initiator for electroless metal plating on a negative pattern area of a thermo-setting resin, said thermo-setting resin comprising a thermo-setting resin composition containing at least one of epoxy resin, polyester resin and phenol resin, at least one of silicone resin and wax and an effective amount of inhibitor capable of reducing the deposition of the initiator, activity of said resin for deposition of the initiator for electroless metal plating being substantially reduced, and a positive pattern area on which electroless plated film of the circuit is to be formed is allowed to contact with an initiator washing liquid of an aqueous solution consisting essentially of 5 to 100 grams of at least one organic acid selected from the group consisting of tartaric acid, citric acid, oxalic acid and maleic acid, and 1 to 4 N hydrochloric acid or 0.1 to 0.5 N nitric acid per one liter of said aqueous solution to dissolve and remove said initiator deposited on the negative pattern area before said insulating substrate is immersed in an electroless metal plating solution to form a circuit conductor by electroless plating on said positive pattern area.

4. A method for producing a printed circuit by electroless metal plating wherein an insulating substrate having initiator for electroless metal plating on a negative pattern area of a thermo-setting resin, the thermo-setting resin comprising a resin composition which comprises 100 parts by weight of at least one of epoxy resin, polyester resin and phenol resin and 2-20 parts by weight of an additive which imparts water repellency to the resin and having a viscosity of $10^2$-$10^4$ poises (at 25° C.) coated on the substrate in negative pattern and heated to harden it, activity of said resin for deposition of the initiator for electroless metal plating being substantially reduced, and a positive pattern area on which the electroless plated film of the circuit is to be formed is allowed to contact with an initiator washing liquid of an aqueous solution consisting essentially of 5 to 100 grams of at least one organic acid selected from the group consisting of tartaric acid, citric acid, oxalic acid and maleic acid, and 1 to 4 N hydrochloric acid or 0.1 to 0.5 N nitric acid per one liter of said aqueous solution to dissolve and remove said initiator deposited on the negative pattern area before said insulating substrate is immersed in an electroless metal plating solution to form a circuit conductor by electroless plating on said positive pattern area.

5. A method for producing a printed circuit according to claim 4, wherein said additive is selected from the group consisting of silicone resin and wax.

6. A method for producing a printed circuit by electroless metal plating wherein an insulating substrate having initiator for electroless metal plating on a negative pattern area of a thermo-setting resin, said thermo-setting resin comprising a thermo-setting composition containing at least one of epoxy resin, polyester resin and phenol resin and an effective amount of an additive which imparts water repellency to the resin, activity of said resin for deposition of the initiator for electroless metal plating being substantially reduced, and a positive pattern area on which electroless plated film of the circuit is to be formed is allowed to contact with an initiator washing liquid of an aqueous solution consisting essentially of 5 to 100 grams of at least one organic acid selected from the group consisting of tartaric acid, citric acid, oxalic acid and maleic acid, and 1 to 4 N hydrochloric acid or 0.1 to 0.5 N nitric acid per one liter of said aqueous solution to dissolve and remove said initiator deposited on the negative pattern area before said insulating substrate is immersed in an electroless metal plating solution to form a circuit conductor by electroless plating on said positive pattern area.

7. A method for producing a printed circuit according to claim 6, wherein the thermo-setting resin comprises, for every 100 parts by weight of a thermo-setting resin composition containing at least one of epoxy resin, polyester resin and phenol resin, 2-20 parts by weight of an additive which imparts water repellency to the resin.

8. A method for producing a printed circuit by electroless metal plating wherein an insulating substrate having initiator for electroless metal plating on a negative pattern area of a thermo-setting resin, said thermo-setting resin comprising a thermo-setting composition containing at least one of epoxy resin, polyester resin and phenol resin, an effective amount of an additive which imparts water repellency to the resin and an effective amount of inhibitor capable of reducing the deposition of the initiator, activity of said resin for deposition of the initiator for electroless metal plating being substantially reduced, and a positive pattern area on which electroless plated film of the circuit is to be formed is allowed to contact with an initiator washing liquid of an aqueous solution consisting essentially of 5 to 100 grams of at least one organic acid selected from the group consisting of tartaric acid, citric acid, oxalic acid and maleic acid, and 1 to 4 N hydrochloric acid or 0.1 to 0.5 N nitric acid per one liter of said aqueous solution to dissolve and remove said initiator deposited on the negative pattern area before said insulating substrate is immersed in an electroless metal plating solution to form a circuit conductor by electroless plating on said positive pattern area.

9. A method for producing a printed circuit according to claim 8, wherein the thermo-setting resin comprises, for every 100 parts by weight of a thermo-setting composition containing at least one of epoxy resin, polyester resin and phenol resin, 2-20 parts by weight of an additive which imparts water repellency to the resin and 1-30 parts by weight of inhibitor capable of reducing the deposition of the initiator.

10. A method for producing a printed circuit according to claim 9, wherein said additive which imparts water repellency to the resin is selected from the group consisting of silicone resin and wax.

11. A method for producing a printed circuit by electroless metal plating wherein an insulating substrate having initiator for electroless metal plating on a negative pattern area of a thermo-setting resin, the thermo-setting resin comprising a thermo-setting resin composition containing at least one of epoxy resin, polyester resin and phenol resin, an effective amount of an additive which imparts water repellency to the resin and an effective amount of an inhibitor capable of reducing the deposition of the initiator and having a viscosity of $10^2-10^4$ poises (at 25° C.) coated in a negative pattern on the substrate, with the coated substrate being heated to harden the resin, activity of said resin for deposition of the initiator for electroless metal plating being substantially reduced, and a positive pattern area on which electroless plated film of the circuit is to be formed is allowed to contact with an initiator washing liquid of an aqueous solution consisting essentially of 5 to 100 grams of at least one organic acid selected from the group consisting of tartaric acid, citric acid, oxalic acid and maleic acid, and 1 to 4 N hydrochloric acid or 0.1 to 0.5 N nitric acid per one liter of said aqueous solution to dissolve and remove said initiator deposited on the negative pattern area before said insulating substrate is immersed in an electroless metal plating solution to form a circuit conductor by electroless plating on said positive pattern area.

* * * * *